(12) United States Patent
Seo et al.

(10) Patent No.: US 11,329,116 B2
(45) Date of Patent: May 10, 2022

(54) DISPLAY DEVICE AND MANUFACTURING METHOD THEREOF

(71) Applicant: SAMSUNG DISPLAY CO., LTD., Yongin-si (KR)

(72) Inventors: Seok Hoon Seo, Asan-si (KR); Dae Sang Yun, Cheongju-si (KR); Che Ho Lee, Suwon-si (KR); So Yeon Jeong, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 82 days.

(21) Appl. No.: 16/591,048

(22) Filed: Oct. 2, 2019

(65) Prior Publication Data

US 2020/0176519 A1 Jun. 4, 2020

(30) Foreign Application Priority Data

Nov. 29, 2018 (KR) ........................ 10-2018-0151186

(51) Int. Cl.
*H01L 27/32* (2006.01)
*H01L 27/28* (2006.01)
*H01L 33/52* (2010.01)

(52) U.S. Cl.
CPC .......... *H01L 27/326* (2013.01); *H01L 27/286* (2013.01); *H01L 27/3246* (2013.01); *H01L 33/52* (2013.01); *H01L 2227/32* (2013.01)

(58) Field of Classification Search
CPC . H01L 27/326; H01L 27/286; H01L 27/3246; H01L 27/3227; H01L 51/56; H01L 33/52; H01L 2227/32
See application file for complete search history.

(56) References Cited

U.S. PATENT DOCUMENTS

| 2002/0180371 | A1* | 12/2002 | Yamazaki | H01L 27/3246 315/169.3 |
| 2011/0220901 | A1* | 9/2011 | Ha | H01L 27/3276 257/59 |
| 2013/0270578 | A1* | 10/2013 | Kramer | H01L 23/3738 257/77 |

(Continued)

FOREIGN PATENT DOCUMENTS

| KR | 10-1702589 | 1/2017 |
| KR | 10-2017-0059864 | 5/2017 |
| KR | 10-2017-0066767 | 6/2017 |

OTHER PUBLICATIONS

European Search Report dated Apr. 17, 2020 in corresponding European Patent Application No. 19210830.6 (9 pages).

*Primary Examiner* — Vongsavanh Sengdara
(74) *Attorney, Agent, or Firm* — F. Chau & Associates, LLC

(57) ABSTRACT

A display device includes a first substrate including a display area in which a plurality of pixels are arranged and a light transmitting area disposed in the display area, an interlayer insulating layer covering the display area and exposing the light transmitting area, an inner sidewall of the interlayer insulating layer defining the light transmitting area, and an inorganic film disposed directly on the first substrate in the light transmitting area and overlapping the entire light transmitting area. A size of the light transmitting area is larger than a size of a pixel of the plurality of pixels.

8 Claims, 16 Drawing Sheets

(56) References Cited

U.S. PATENT DOCUMENTS

| | | | |
|---|---|---|---|
| 2014/0145150 A1* | 5/2014 | de Jong | H01L 27/3227 257/40 |
| 2016/0035796 A1* | 2/2016 | Ikeda | H01L 27/322 257/40 |
| 2016/0300902 A1* | 10/2016 | You | H01L 27/3258 |
| 2016/0348874 A1* | 12/2016 | Aruga | F21V 5/045 |
| 2017/0047544 A1* | 2/2017 | Kang | H01L 51/56 |
| 2017/0062528 A1* | 3/2017 | Aoyama | H01L 27/3246 |
| 2017/0133444 A1 | 5/2017 | Lee et al. | |
| 2017/0205771 A1 | 7/2017 | Lin et al. | |
| 2018/0145118 A1* | 5/2018 | Kim | G09G 3/3258 |
| 2018/0151834 A1 | 5/2018 | Kanaya | |
| 2018/0219058 A1* | 8/2018 | Xiang | H01L 27/3279 |
| 2019/0051711 A1* | 2/2019 | Lee | G06F 3/0446 |

* cited by examiner

DISPLAY DEVICE AND MANUFACTURING METHOD THEREOF

CROSS-REFERENCE TO RELATED APPLICATION

This application claims priority to Korean Patent Application No. 10-2018-0151186 filed on Nov. 29, 2018 in the Korean Intellectual Property Office, the entire contents of which are incorporated by reference herein in its entirety.

BACKGROUND

(a) Field

The present invention relates to a display device and a manufacturing method thereof. More particularly, the present invention relates to a display device including a light transmitting area or a hole and a manufacturing method thereof.

(b) Description of the Related Art

Recently, various portable electronic devices have included a camera function, such that consumers carry only one electronic device having the camera function rather than separately carry a camera.

Conventionally, a camera, a flash, a speaker, an optical sensor, and the like exist outside of a display area of the electronic device, and the space in which the electronic device can display an image is reduced.

The above information disclosed in this Background section is only for enhancement of understanding of the background of the invention and therefore it may contain information that does not form the prior art that is already known in this country to a person of ordinary skill in the art.

SUMMARY

Research is underway to expand the space in which images can be displayed by placing devices such as a camera in the display area. The present invention provides a manufacturing method thereof that is capable of more effectively forming a light transmitting area or a hole where a device such as a camera is located in a display area, and a display device manufactured by the manufacturing method.

According to an exemplary embodiment of the present inventive concept, a display device includes a first substrate including a display area in which a plurality of pixels are arranged and a light transmitting area disposed in the display area, an interlayer insulating layer covering the display area and exposing the light transmitting area, an inner sidewall of the interlayer insulating layer defining the light transmitting area, and an inorganic film disposed directly on the first substrate in the light transmitting area and overlapping the entire light transmitting area. A size of the light transmitting area is larger than a size of a pixel of the plurality of pixels.

According to an exemplary embodiment of the present inventive concept, a display device includes a first substrate, a display area including a plurality of pixels arranged on the first substrate, each of the plurality of pixels including a light emitting element including a pixel electrode, an emission layer, and a common electrode, a light transmitting area disposed in the display area and including a first light transmitting area and a second light transmitting area surrounding the first light transmitting area, an interlayer insulating layer covering the display area and exposing the light transmitting area, an inner sidewall of the interlayer insulating layer defining the light transmitting area, and a remaining portion with a lifting shape separated from the first substrate in the second light transmitting area, the remaining portion including a first layer formed of the same material as the common electrode and disconnected therefrom by the inner sidewall of the interlayer insulating layer.

According to an exemplary embodiment of the present inventive concept, a manufacturing method of a display device is provided as follows. A transistor is formed on a first substrate including a display area and a light transmitting area. An interlayer insulation layer is formed to cover the display area and expose the light transmitting area. A planarization insulating layer is formed on the interlayer insulation layer, wherein a pixel electrode is connected to the transistor through an opening of the planarization insulating layer. A pixel definition layer including an opening exposing the pixel electrode is formed. A sacrificial layer including an organic material is formed in the light transmitting area, wherein a sidewall of the sacrificial layer is spaced apart from an inner sidewall of the interlayer insulation layer. An emission layer and a common electrode are formed in the display area and the light transmitting area. The sacrificial layer is separated from the first substrate by pulling the sacrificial layer with a vacuum adsorption member.

DETAILED DESCRIPTION OF EXEMPLARY EMBODIMENTS

Figure 1:
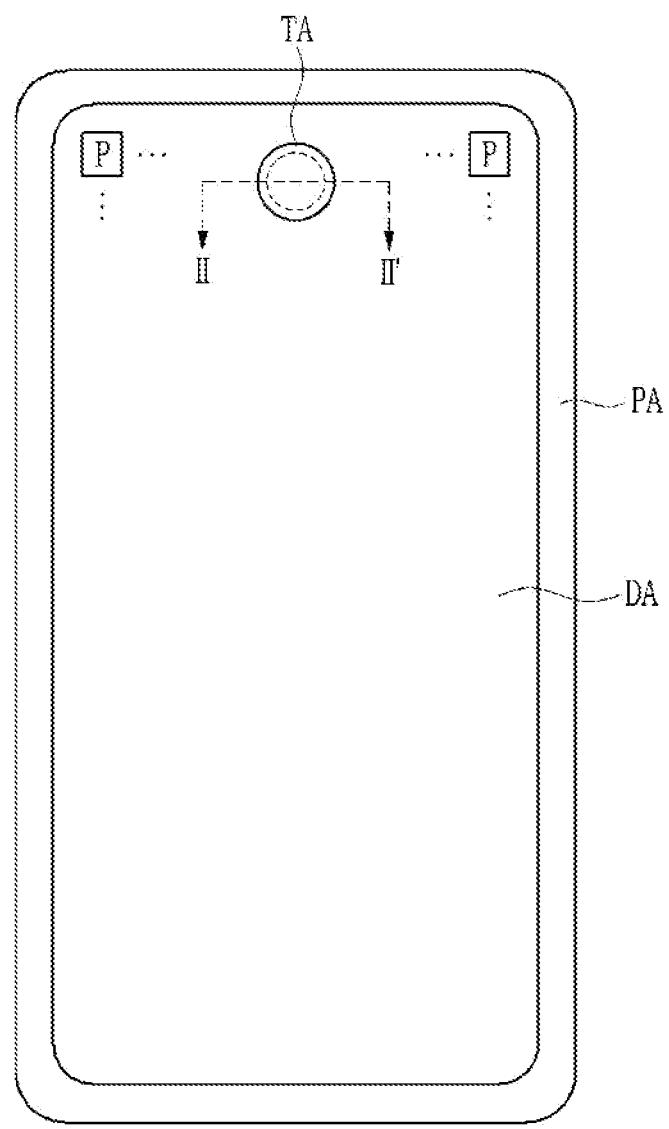
FIG. 1 is a schematic top plan view of a display device according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clearly explain the present invention, portions that are not directly related to the present invention are omitted, and the same reference numerals are attached to the same or similar constituent elements through the entire specification.

In addition, the size and thickness of each configuration shown in the drawings are arbitrarily shown for better understanding and ease of description, but the present invention is not limited thereto. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

Now, a display device according to an exemplary embodiment is described with reference to FIG. 1.

FIG. 1 is a schematic top plan view of a display device according to an exemplary embodiment of the present invention.

Referring to FIG. 1, the display device includes a display area DA, a peripheral area PA, and a light transmitting area TA.

The display area DA is an area in which a plurality of pixels P are arranged and an image is displayed. Each of the plurality of pixels P includes a pixel circuit and a light emitting element which is electrically connected to the pixel circuit. The plurality of pixels P surround the light transmitting area TA.

The light transmitting area TA is disposed in the display area DA. The light transmitting area TA has relatively higher light transmittance than that of the display area DA or the peripheral area PA, and the light transmitting area TA is an area where light is incident to at least one of optical members (see 10 in FIG. 2), or light is emitted from the optical member 10. The optical member 10 may include a camera, a flash, an optical sensor, and the like.

The light transmitting area TA may include a hole structure or an opening structure. The hole structure includes at least substrate in the light transmitting area TA. The opening structure includes an opening in the light transmitting area TA.

A size of the light transmitting area TA is larger than a size of a pixel P, and the light transmitting area TA is different from a light transmitting zone in the pixel P for implementing a transparent display. For example, a width of one pixel may be 25 μm to 50 μm in a plan view, and a diameter of the light transmitting area TA may be about 3 mm.

The diameter of the light transmitting area TA may be 60 or more times the width of one pixel.

In FIG. 1, it is exemplified that one circular light transmitting area TA is disposed at the center of an upper side of the display area DA. The position, shape, number, and the like of the light transmitting area TA are not limited thereto. The light transmitting area TA may have various shapes such as a polygon like a quadrangle, an ellipse, or the like.

The peripheral area PA is an area surrounding the display area DA. A gate driver (not shown) and a data driver (not shown) that transmit signals to each pixel of the plurality of pixels P may be disposed in the peripheral area PA.

Hereinafter, a cross-sectional structure taken along line of FIG. 1 is described.

Figure 2:
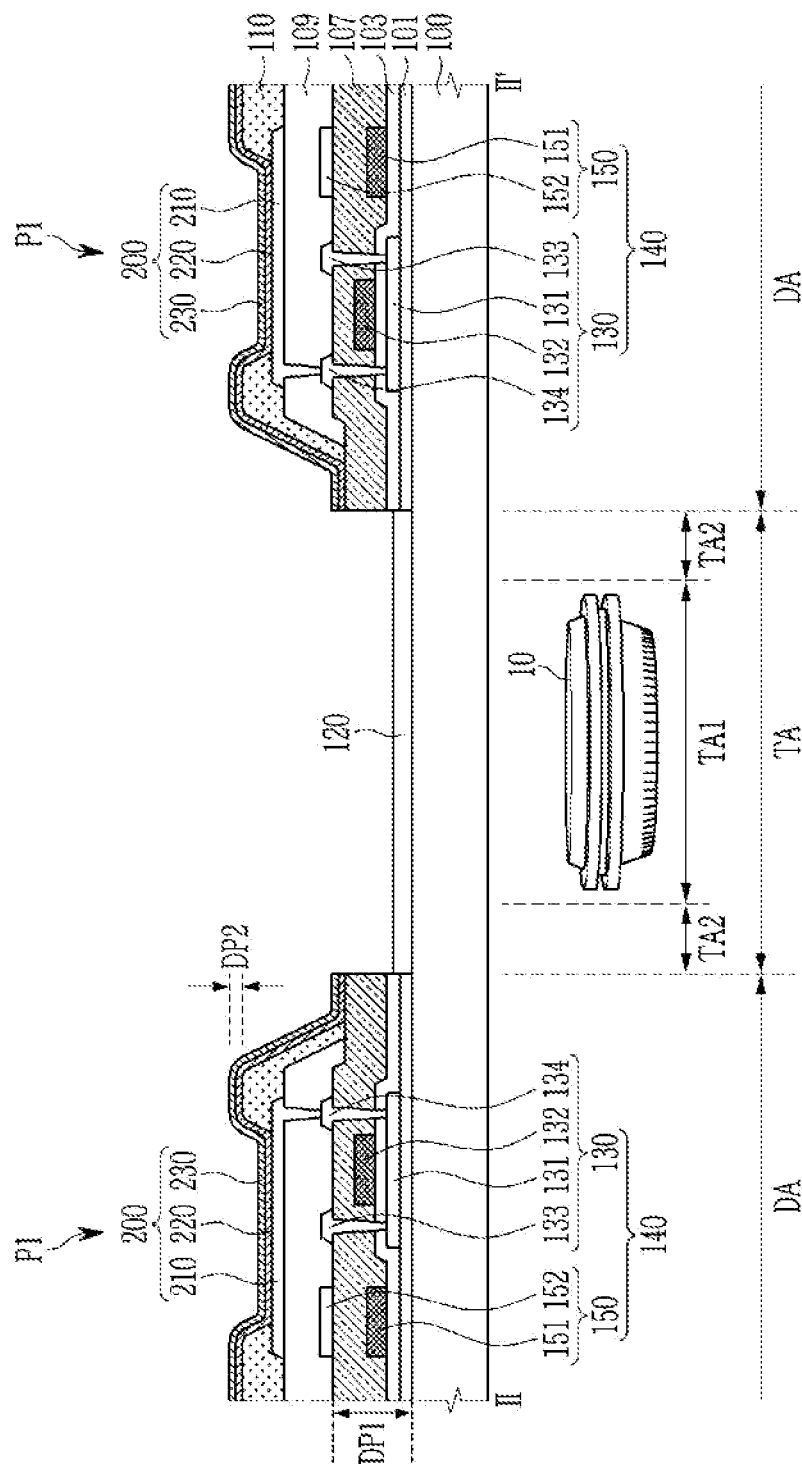
FIG. 2 is a cross-sectional view taken along the line II-II' of the display device of FIG. 1.

FIG. 2 is a cross-sectional view taken along line II-II' of the display device of FIG. 1.

FIG. 2 shows a case in which the light transmitting area TA includes a hole structure. A pixel P1 adjacent to the light transmitting area TA among the plurality of pixels P is exemplified. A first substrate 100 includes the light transmitting area TA and the display area DA. The light transmitting area TA includes a first light transmitting area TA1 where the optical member 10 is disposed, and a second light transmitting area TA2 surrounding the first light transmitting area TA1. The second light transmitting area TA2 may be an area for encapsulating the display area DA.

The light transmitting area TA includes the first substrate 100 and an inorganic film 120 disposed directly on the first substrate 100. The first substrate 100 may include a material such as glass, metal, or an inorganic material. The first substrate 100 may be flexible to be bent, curved, or rolled.

The inorganic film 120 overlaps the entire light transmitting area TA. The inorganic film 120 may be made of the same material as at least one of a buffer layer 101 and a gate insulating layer 103 described later. The inorganic film 120 may be formed together with at least one of the buffer layer 101 and the gate insulating layer 103. A thickness of the inorganic film 120 may be equal to or greater than a thickness of any one of the buffer layer 101 and the gate insulating layer 103. In an example embodiment, the thickness of the inorganic film 120 may be equal to the thickness of the buffer layer 101. In an example embodiment, the thickness of the inorganic layer may be equal to a sum of a thickness of the buffer layer 101 and a thickness of the gate insulating layer 103.

The present invention is not limited thereto. For example, the inorganic film 120 may be formed on the first substrate 100 in a separate process from a process of forming the buffer layer 101 and the gate insulating layer 103. The thickness of the inorganic film 120 formed in the separate process from the process of forming the buffer layer 101 and the gate insulating layer 103 may be equal to or greater than the thickness of the buffer layer 101 and less than the sum of the thickness of the buffer layer 101 and the thickness of the gate insulating layer 103.

As such, the thickness of the inorganic film 120 may be variously changed according to an exemplary embodiment, and the thickness of the inorganic film 120 is arbitrarily shown in FIG. 2, but it is not limited thereto.

In the display area DA, the buffer layer 101 is disposed on the first substrate 100. The buffer layer 101 may block penetration of moisture, foreign matter, and the like from the first substrate 100 into a transistor 130 that is formed thereon. The buffer layer 101 may include an inorganic material such as an oxide or a nitride. The pixel circuit 140 including a transistor 130 and a storage capacitor 150 is disposed on the buffer layer 101.

The transistor 130 includes a semiconductor layer 131, a gate electrode 132, a source electrode 133, and a drain electrode 134. The transistor 130 also includes the gate insulating layer 103 disposed between the semiconductor layer 131 and the gate electrode 132. An interlayer insulating layer 107 is disposed on the gate electrode 132, and the source electrode 133 and the drain electrode 134 are disposed on the interlayer insulating layer 107. For example, the interlayer insulating layer 107 covers the gate electrode 132, and the source electrode 133 and the drain electrode 134 penetrate the interlayer insulating layer 107 to be connected to the semiconductor layer 131.

The semiconductor layer 131 may include amorphous silicon, polysilicon, or an oxide semiconductor.

The gate insulating layer 103 and the interlayer insulating layer 107 may include an inorganic material including oxide or nitride. For example, the gate insulating layer 103 and the interlayer insulating layer 107 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The gate electrode 132, the source electrode 133, and the drain electrode 134 may include a low resistance metal material. For example, the gate electrode 132, the source electrode 133, and the drain electrode 134 may include a conductive material including molybdenum (Mo), aluminum (Al), copper (Cu), titanium (Ti), or the like.

The storage capacitor 150 includes a lower electrode 151, an upper electrode 152 and the interlayer insulating layer 107 interposed therebetween. The lower electrode 151 may be the same layer as the gate electrode 132, and the upper electrode 152 may be the same layer as the source electrode 133 and the drain electrode 134.

A planarization insulating layer 109 is disposed on the pixel circuit 140, and a light emitting element 200 is disposed on the planarization insulating layer 109. The light emitting element 200 is electrically connected to the pixel circuit 140.

The light emitting element 200 includes a pixel electrode 210, an emission layer 220, and a common electrode 230. The pixel electrode 210 is connected to the drain electrode 134 of the transistor 130. The pixel electrode 210 may be a (semi) transparent electrode or a reflecting electrode. For example, the (semi) transparent electrode may include ITO (indium tin oxide), IZO (indium zinc oxide), ZnO (zinc oxide), $In_2O_3$ (indium oxide), IGO (indium gallium oxide), or AZO (aluminum zinc oxide). The reflecting electrode may include a reflective film including Ag, Mg, Al, Pt, Pd, Au, Ni, Nd, Ir, Cr, or a compound thereof, and the reflecting electrode may further include a film formed of ITO, IZO, ZnO, or $In_2O_3$ on the reflective film.

A pixel definition layer 110 including an opening exposing the pixel electrode 210 is disposed on the pixel electrode 210. The emission layer 220 is disposed on the pixel electrode 210 and the pixel definition layer 110, and the common electrode 230 is disposed on the emission layer 220. The emission layer 220 includes a portion positioned in the opening of the pixel definition layer 110. The present invention is not limited thereto. For example, the emission layer 220 may be separately formed in the opening of the pixel definition layer 110. The emission layer 220 may include an organic light emitting material or an inorganic light emitting material. The common electrode 230 may be a (semi) transparent electrode or a reflecting electrode. At least one of the planarization insulating layer 109 and the pixel definition layer 110 may include an acryl-based resin, a siloxane organic material, a silazane organic material, or the like.

A layer including the buffer layer 101 the gate insulating layer 103, and the interlayer insulating layer 107 made of an inorganic material is referred to as a lower inorganic layer. A layer including the emission layer 220 and the common electrode 230 is referred to as an upper emission layer. A thickness DP1 of the lower inorganic layer is greater than a thickness DP2 of the upper emission layer. For example, the thickness DP1 of the lower inorganic layer is about 1.5 μm, and the thickness DP2 of the upper emission layer is about 0.4 μm.

The emission layer 220 and the common electrode 230 may be deposited in a state in which only the inorganic film 120 is formed in the light transmitting area TA of the first substrate 100 in the manufacturing process of the display device. In this case, the emission layer 220 and the common electrode 230 may be formed in a layer-broken form at the boundary between the display area DA and the light transmitting area TA due to the step difference by the lower inorganic layer. A structure preventing penetration of moisture or the like through the surfaces of the layers disconnected at the boundary between the display area DA and the light transmitting area TA will be described later with reference to FIG. 9 to FIG. 11.

The optical member 10 is disposed in the first light transmitting area TA1. External light may be incident on the optical member 10 through the first light transmitting area TA1, or light may be emitted from the optical member 10 to the outside through the first light transmitting area TA1.

Figure 9:
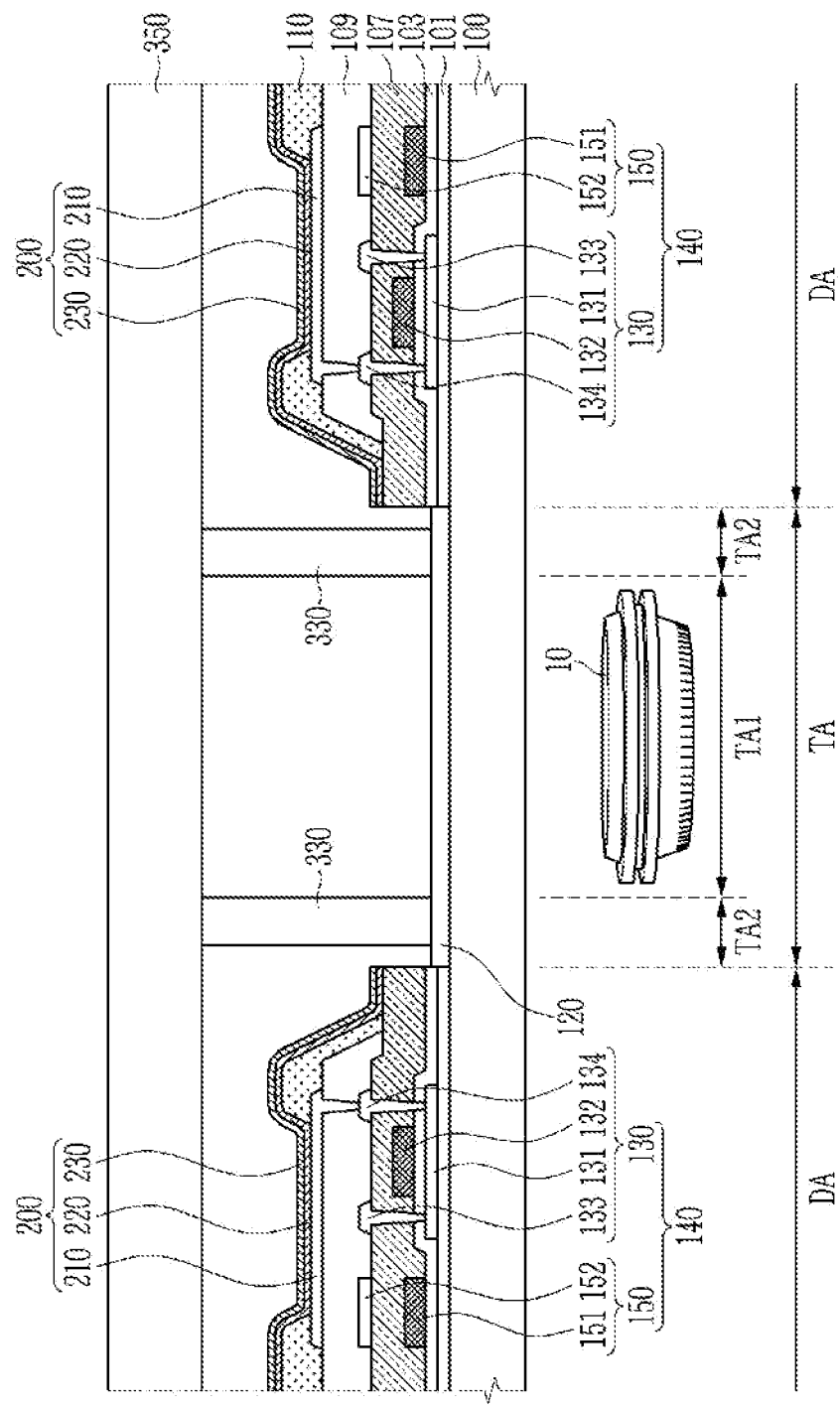
FIG. 9 is a cross-sectional view showing an exemplary embodiment in which the display device of FIG. 2 is encapsulated.
Figure 10:
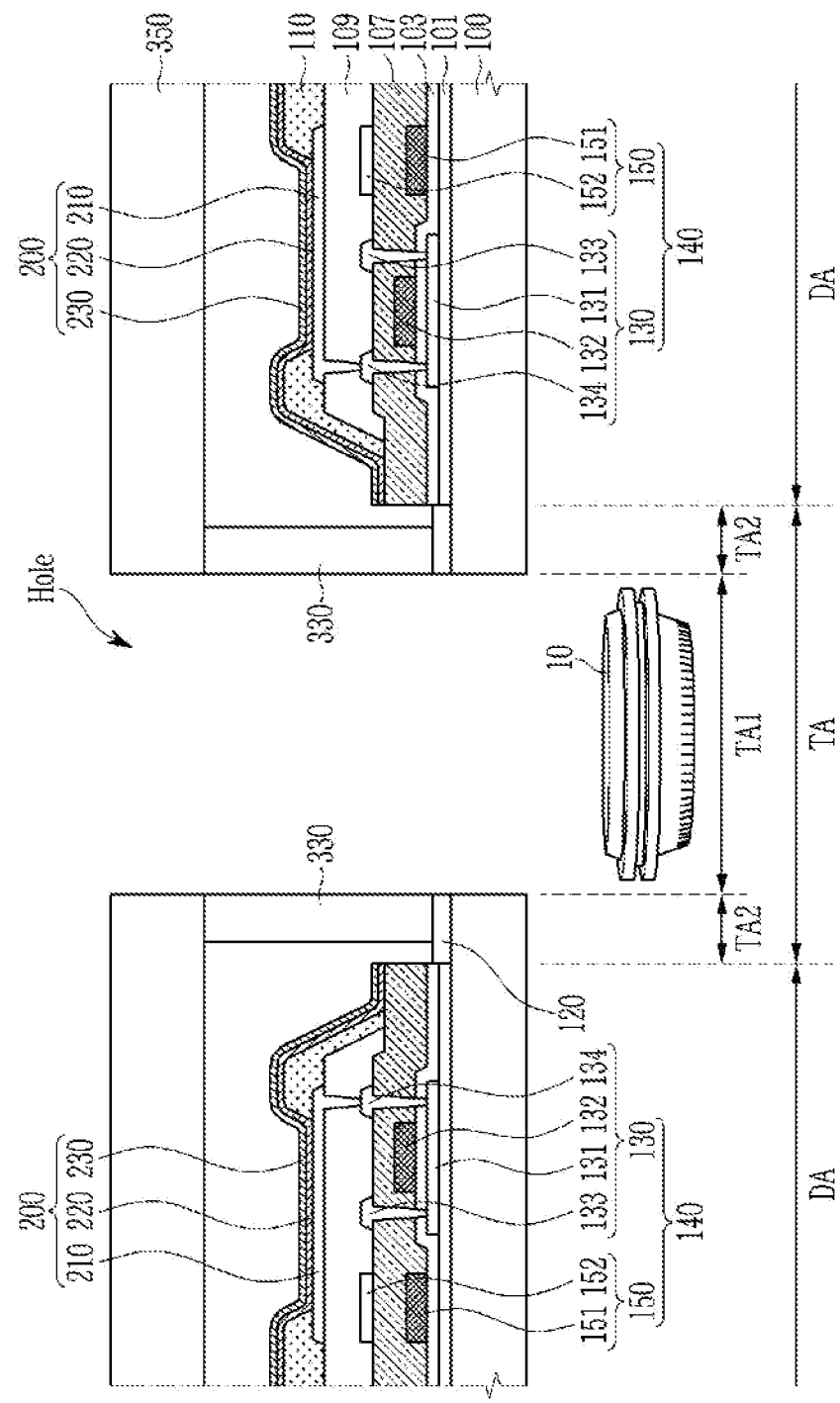
FIG. 10 is a cross-sectional view showing an exemplary embodiment in which the display device of FIG. 2 is encapsulated.

An encapsulation member 330 described later with reference to FIG. 9 and FIG. 10 is disposed in the second light transmitting area TA2. An encapsulation structure of the display device is omitted in FIG. 2, and the encapsulation structure will be described later with reference to FIG. 9 to FIG. 11.

FIG. 3 to FIG. 8 are cross-sectional views illustrating a manufacturing method of a display device according to an exemplary embodiment of the present invention. FIG. 3 to FIG. 8 relate to a manufacturing method of the above-described display device in FIG. 1 and FIG. 2.

Figure 3:
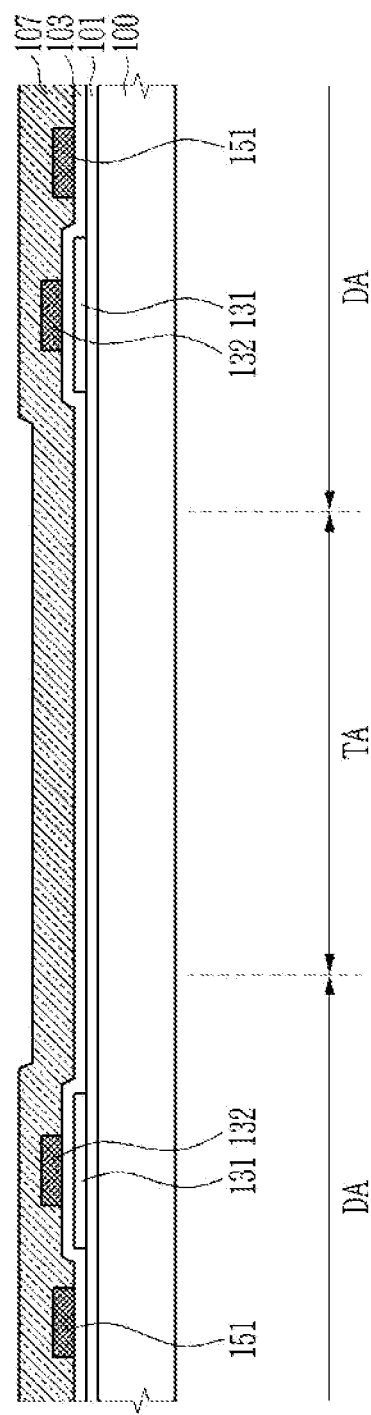
FIG. 3 to FIG. 8 are cross-sectional views illustrating a manufacturing method of a display device according to an exemplary embodiment of the present invention.

Referring to FIG. 3, the buffer layer 101 is formed on a first substrate 100 including the display area DA and the light transmitting area TA. A semiconductor material may be formed on the buffer layer 101, and then patterned to form the semiconductor layer 131. The gate insulating layer 103 is formed on the buffer layer 101 and the semiconductor layer 131. A first conductive layer may be formed on the gate insulating layer 103 and then patterned to form the gate electrode 132 of the transistor 130 and the lower electrode 151 of the storage capacitor 150. The first conductive layer may include a low resistance metal material. The interlayer insulating layer 107 is formed on the gate insulating layer 103, the gate electrode 132, and the lower electrode 151.

Figure 4:
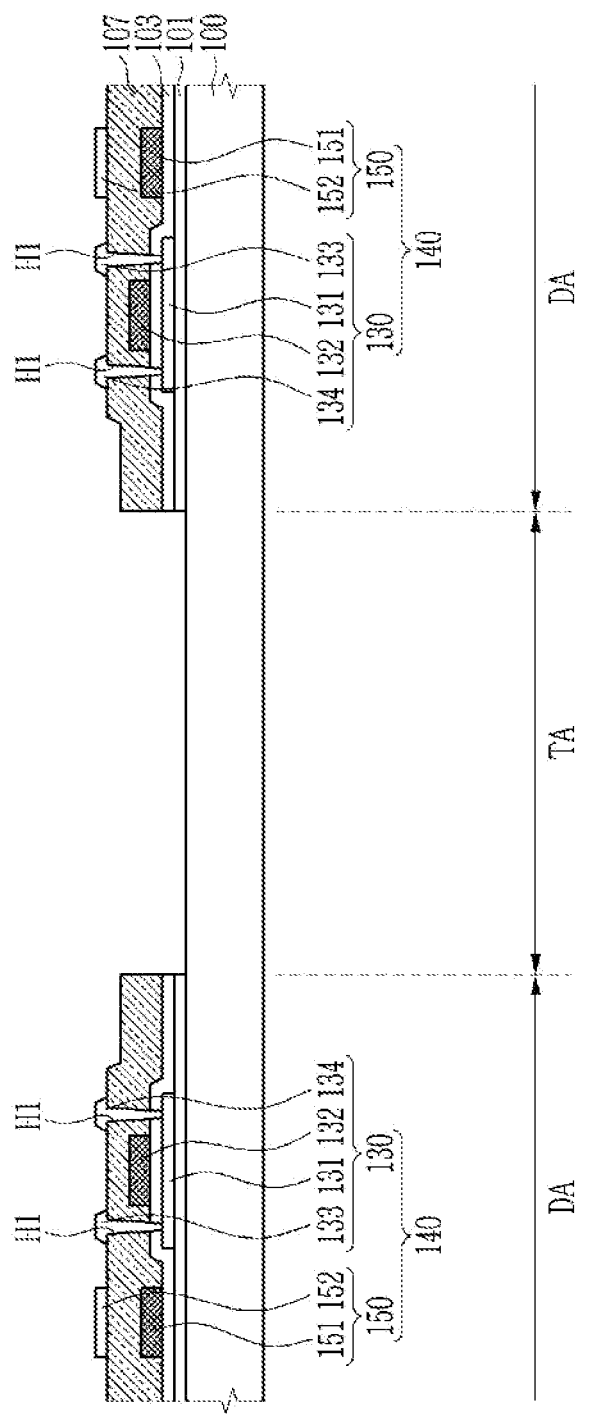

Referring to FIG. 4, by an etching process, openings H1 overlapping a source region and a drain region of the semiconductor layer 131 are formed in the interlayer insulating layer 107 and the gate insulating layer 103 in the display area DA and the buffer layer 101, the gate insulating layer 103, and the interlayer insulating layer 107 are removed in the light transmitting area TA. The source region and the drain region of the semiconductor layer 131 may be exposed through the openings H1. A second conductive layer may be formed on the interlayer insulating layer 107, and then the second conductive layer may be patterned to form the source electrode 133 and the drain electrode 134 of the transistor 130 and the upper electrode 152 of the storage capacitor 150. The second conductive layer may include a low resistance metal material. The source electrode 133 and the drain electrode 134 may be connected to the source region and the drain region of the semiconductor layer 131 exposed through the openings H1, respectively. The upper electrode 152 overlaps the lower electrode 151 with the interlayer insulating layer 107 interposed therebetween.

Figure 5:
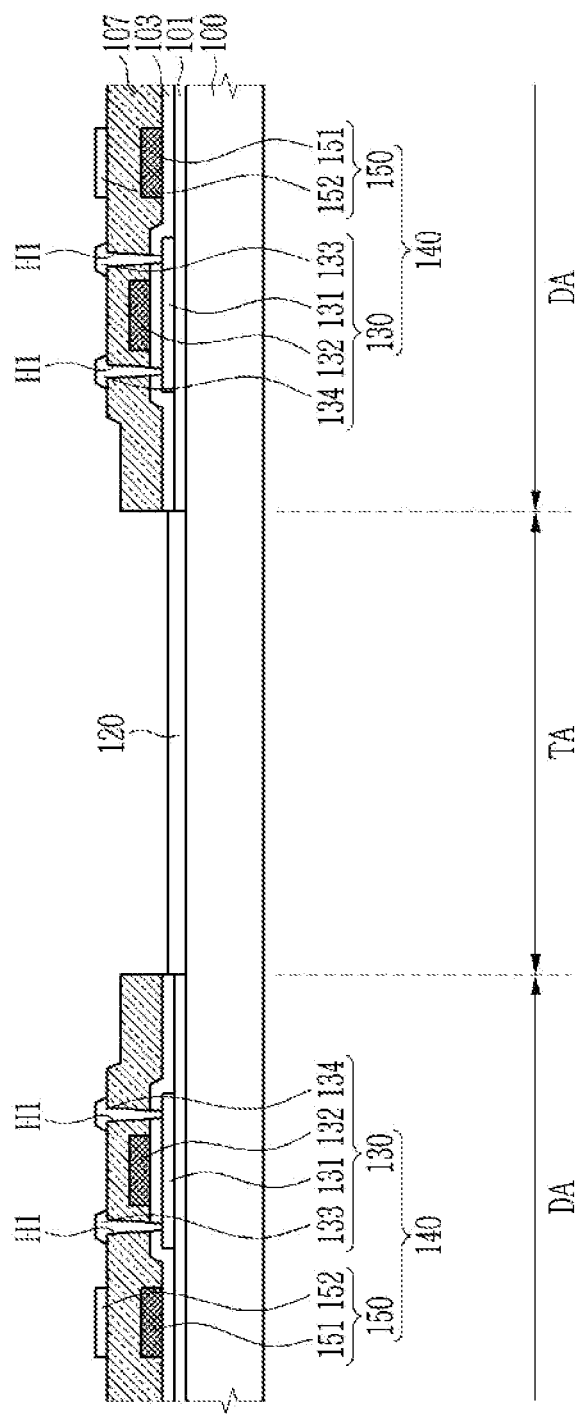

Referring to FIG. 5, the inorganic film 120 is formed in the light transmitting area TA by depositing an inorganic material on the first substrate 100 and then patterning the inorganic material. The inorganic material may include oxide or nitride. FIG. 5 shows a case in which the inorganic film 120 is formed in a separate process from a process of forming the buffer layer 101 and the gate insulating layer 103.

Meanwhile, the inorganic film 120 may be formed together with at least one of the buffer layer 101 and the gate insulating layer 103. In this case, the process of FIG. 5 may be omitted, and only the interlayer insulating layer 107 may be removed without removing the buffer layer 101 and the gate insulating layer 103 in the light transmitting area TA, or only the interlayer insulating layer 107 and the gate insulating layer 103 may be removed in the light transmitting area TA in the etching process of FIG. 4.

Hereinafter, the case in which the buffer layer 101 and the gate insulating layer 103 are removed in the etching process of FIG. 4 and then the inorganic film 120 is formed in the light transmitting area TA will be described as an example.

Figure 6:
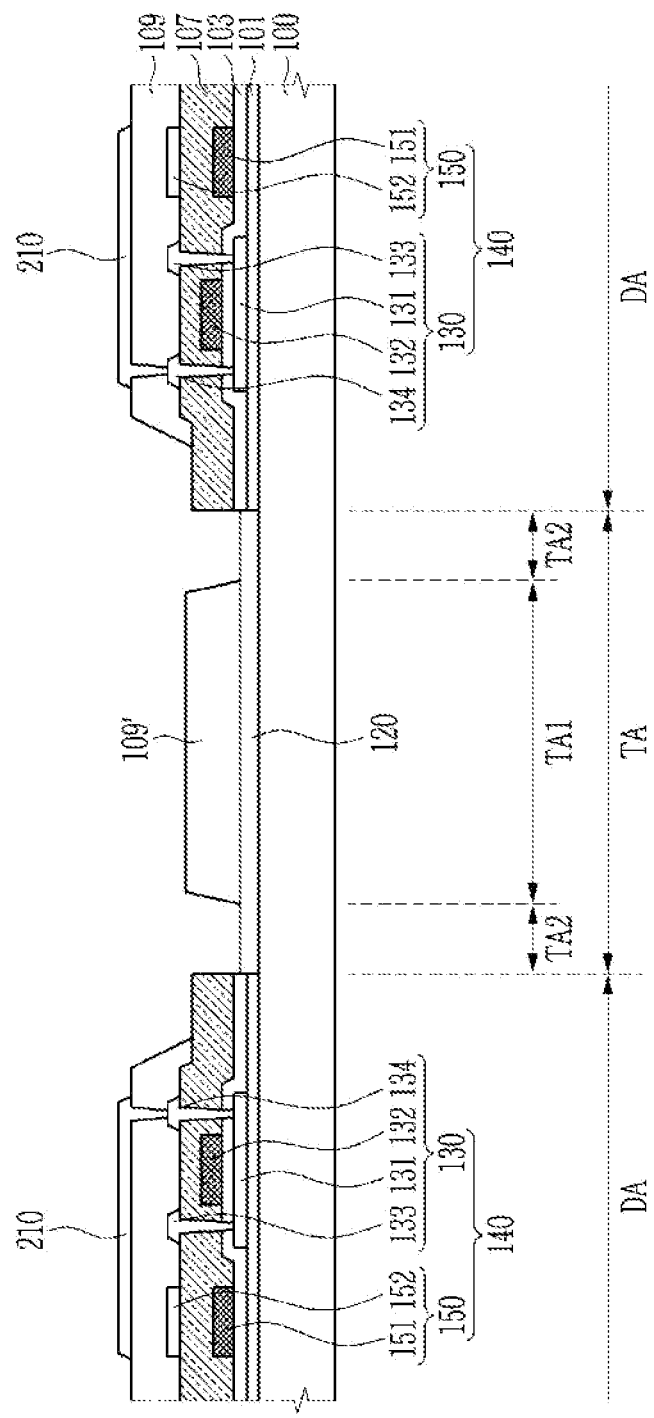

Referring to FIG. 6, a first organic layer is formed in the display area DA and the light transmitting area TA, and then the first organic layer is patterned to form the planarization insulating layer 109 in the display area DA and a first sacrificial layer 109' in the light transmitting area TA. The first organic layer may include an acryl-based resin, a siloxane organic material, a silazane organic material, or the like. The planarization insulating layer 109 includes an opening exposing the drain electrode 134 of the transistor 130. The first sacrificial layer 109' is patterned from the first organic layer to overlap the first light transmitting area TA1 in the light transmitting area TA. For example, the first organic layer is removed in the second light transmitting area TA2. Thereafter, a third conductive layer is formed on the planarization insulating layer 109, and then the third conductive layer is patterned to form the pixel electrode 210. The third conductive layer may include ITO, IZO, ZnO, $In_2O_3$, IGO, AZO, or the like.

Figure 7:
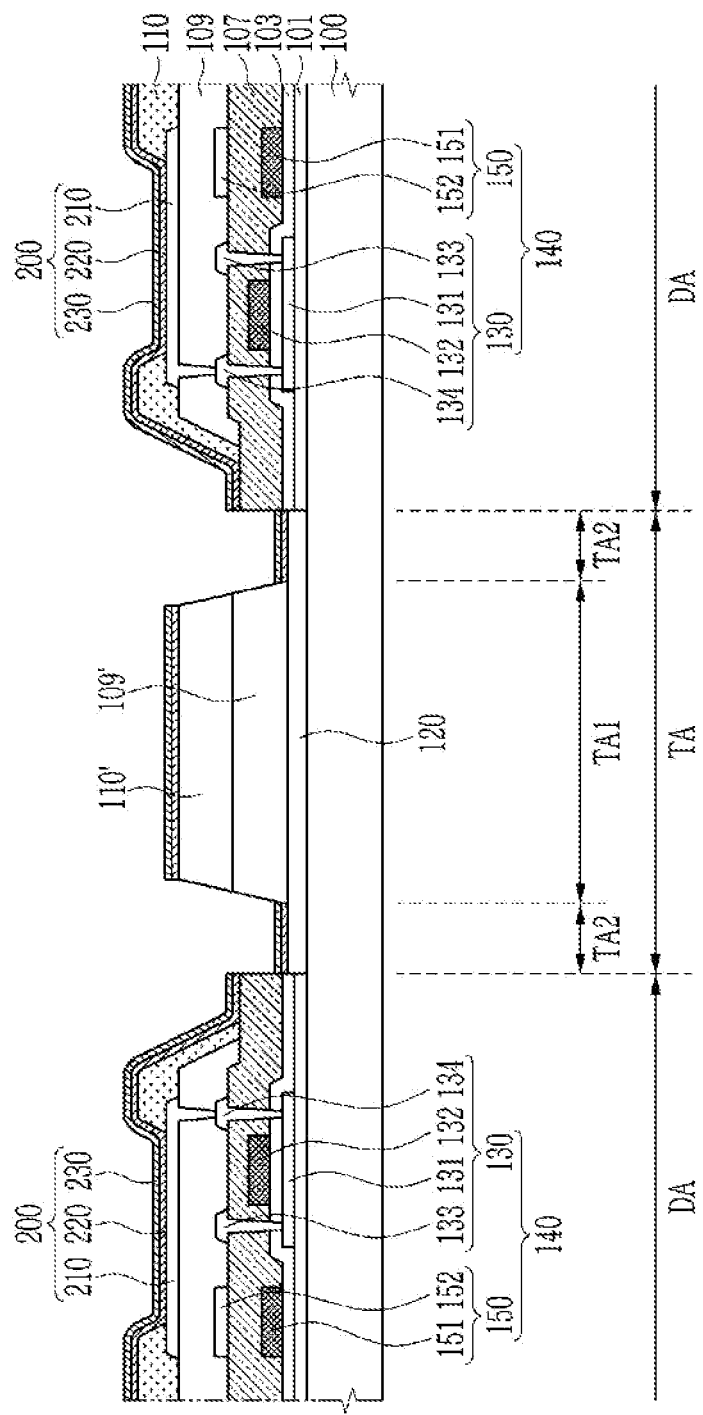

Referring to FIG. 7, a second organic layer is formed in the display area DA and the light transmitting area TA, and then the second organic layer is patterned to form the pixel definition layer 110 in the display area DA and a second sacrificial layer 110' in the light transmitting area TA. The second organic layer may include an acryl-based resin, a siloxane organic material, a silazane organic material, or the like. The pixel definition layer 110 includes an opening exposing the pixel electrode 210. The second sacrificial layer 110' is disposed on the first sacrificial layer 109' and overlap the first light transmitting area TA1.

The emission layer 220 and the common electrode 230 are deposited in the display area DA and the light transmitting area TA. The emission layer 220 and the common electrode 230 are formed to cover the first substrate 100 as a whole. In this case, the emission layer 220 and the common electrode 230 are formed in a layer-broken form at the boundary between the display area DA and the light transmitting area TA due to the step difference by the lower inorganic layer including the buffer layer 101, the gate insulating layer 103, and the interlayer insulating layer 107. For example, the step difference amounts to a height difference between an upper surface of the interlayer insulating layer 107 and upper surface of the inorganic film 120 at the boundary between the first light transmitting area TA1 and the display area DA. That is, the emission layer 220 and the common electrode 230 formed in the second light transmitting area TA2 are disconnected from the emission layer 220 and the common electrode 230 formed in the display region DA, respectively. In addition, the emission layer 220 and the common electrode 230 are formed on the second sacrificial layer 110'. Hereinafter, the emission layer 220 and the common electrode 230 formed in the second light transmitting area TA2 are referred to as a remaining portion.

FIG. 6 and FIG. 7 illustrate that the first sacrificial layer 109' and the second sacrificial layer 110' are both formed. However, only one of the first sacrificial layer 109' and the second sacrificial layer 110' may be formed according to an exemplary embodiment. For example, the second sacrificial layer 110' may be directly formed on the inorganic film 120 without forming the first sacrificial layer 109' in FIG. 6. Alternatively, the first sacrificial layer 109' may be formed on the inorganic film 120 in FIG. 6, and the emission layer 220 and the common electrode 230 may be formed directly on the first sacrificial layer 109' without forming the second sacrificial layer 110' in FIG. 7. The sacrificial layer includes at least one among the first sacrificial layer 109' and the second sacrificial layer 110'.

Figure 8:
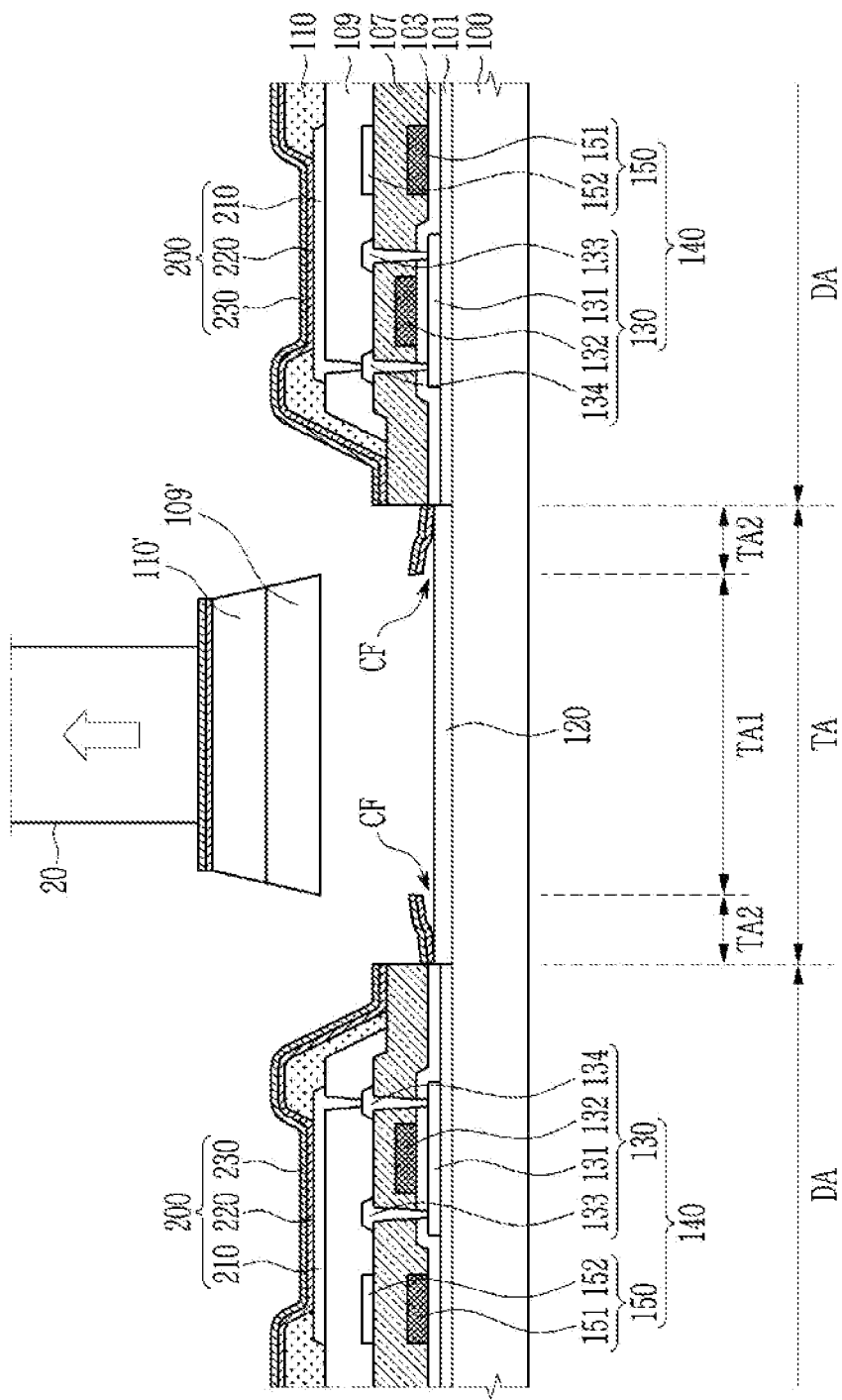

Referring to FIG. 8, the sacrificial layer is adsorbed by a vacuum adsorption member 20 in a chamber (not shown) filled with a non-reactive gas such as nitrogen, and then pulled in a direction perpendicular to the upper surface of the first substrate 100 to be separated from the inorganic film 120. As the sacrificial layer including an organic material has poor adhesion with the inorganic film 120 including an inorganic material, the sacrificial layer may be easily separated by physical force using the vacuum adsorption member 20.

The remaining portion of the emission layer 220 and the common electrode 230 disposed in the second light transmitting area TA2 is in contact with a side surface of the sacrificial layer, and a lifting shape CF is formed in the remaining portion when the sacrificial layer is separated from the first substrate 100 with a physical force. The lifting shape CF is an opened shape in which the remaining portion is separated from the underlying inorganic film 120, and a gap between the remaining portion and the inorganic film 120 may gradually increase from the edge of the light transmitting area TA to the first light transmitting area TA1. For example, the remaining portion is partially lifted from the inorganic film 120 when the sacrificial layer is separated from the first substrate 100. The remaining portion of the emission layer 220 may further include a second layer formed of the same material as the emission layer 220.

The light transmittance of the light transmitting area TA may be lowered when the emission layer 220 and the common electrode 230 remain in the light transmitting area TA, particularly in the first light transmitting area TA1 where the optical member 10 is located. As described above, the emission layer 220 and the common electrode 230 are formed after the sacrificial layer is formed in the first light transmitting area TA1, and then the sacrificial layer is removed, so that the lowering of the light transmittance of the light transmitting area TA is prevented.

Meanwhile, the emission layer 220 and the common electrode 230 formed in the light transmitting area TA may be removed by an etching process using a laser or the like. When the emission layer 220 and the common electrode 230 formed in the light transmitting area TA are removed by the etching process using a laser or the like, particles are generated. Therefore, a cleaning process for removing the particles is required. In addition, the first substrate 100 may be damaged by the laser in the light transmitting area TA.

However, when the emission layer 220 and the common electrode 230 formed in the light transmitting area TA are removed by a method of physically removing the sacrificial layer using the vacuum adsorption member 20 as described above, particles are scarcely generated, and the cleaning process for removing the particles is not required, so that the manufacturing efficiency of the display device may be increased. Furthermore, there is no possibility of the first substrate 100 being damaged by a laser or the like.

Figure 11:
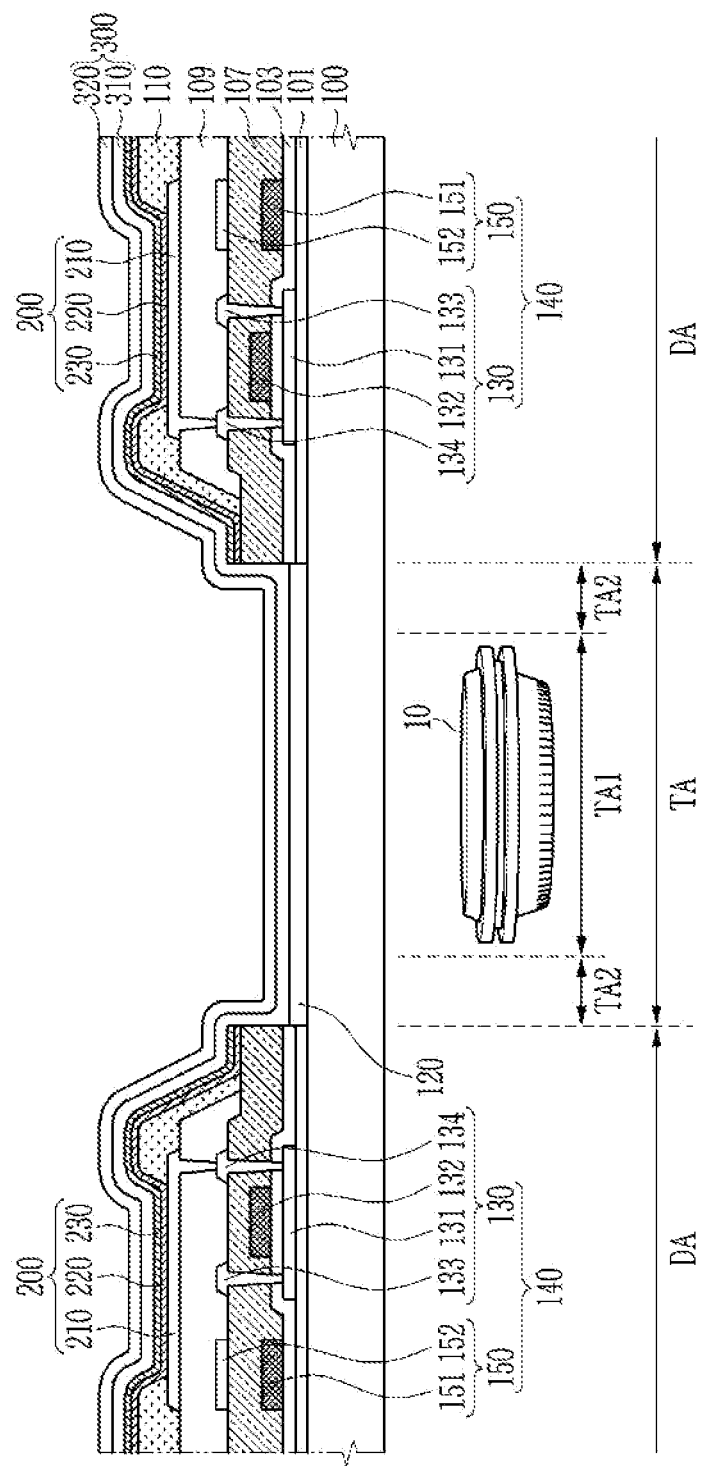
FIG. 11 is a cross-sectional view showing an exemplary embodiment in which the display device of FIG. 2 is encapsulated.

Hereinafter, methods of encapsulating the display device of FIG. 2 manufactured by the manufacturing method of FIG. 3 to FIG. 8 are described with reference to FIG. 9 to FIG. 11, FIG. 9 is a cross-sectional view showing an exemplary embodiment in which the display device of FIG. 2 is encapsulated.

Referring to FIG. 9, the remaining portion of the emission layer 220 and the common electrode 230 in the second light transmitting area TA2 are removed, and the encapsulation member 330 is formed in the second light transmitting area TA2. And then, a second substrate 350 may be disposed on the display area DA and the light transmitting area TA to cover the display area DA and the light transmitting area TA.

The encapsulation member 330 surrounds the first light transmitting area TA1 along the second light transmitting area TA2. The encapsulation member 330 and the second substrate 350 are encapsulating structures encapsulating the display area DA, so that moisture or foreign substances do not penetrate the light emitting element 200 from the outside. The encapsulation member 330 may be a frit including an inorganic material. A lower portion of the encapsulation member 330 is in contact with the inorganic film 120 in the second light transmitting area TA2, and an upper portion of the encapsulation member 330 is in contact with a lower surface of the second substrate 350 in the second light transmitting area TA2. The encapsulation member 330 including the inorganic material may be bonded to the inorganic film 120. For example, the encapsulation member 330 including the inorganic material is in contact with the inorganic film 120 to form an inorganic-inorganic bonding. In addition, the second substrate 350 may include an inorganic material, and the encapsulation member 330 in in contact with the second substrate 350 to form an inorganic-inorganic bonding.

The present invention is not limited thereto. For example, the encapsulation member 330 may be formed in the peripheral area PA described above in FIG. 1 along the peripheral area PA to surround the display area DA. The edge of the first substrate 100 and the edge of the second substrate 350 may be encapsulated and bonded by the encapsulation member in the peripheral area PA.

The optical member 10 is disposed in the first light transmitting area TA1. External light enters the optical member 10 or light is emitted from the optical member 10 to the outside through the first substrate 100, the inorganic film 120, and the second substrate 350. The light transmitting area TA in FIG. 9 is a hole structure.

FIG. 10 is a cross-sectional view showing an exemplary embodiment in which the display device of FIG. 2 is encapsulated.

Referring to FIG. 10, a hole (Hole in FIG. 10) is formed in the first light transmitting area TA1 using a laser or the like in a display device that is encapsulated as shown in FIG. 9. That is, the first substrate 100, the inorganic film 120, and the second substrate 350 are removed in the first light transmitting area TA1 so as to form the hole. The hole passes through the first substrate 100, the inorganic film 120, and the second substrate 350 in the first light transmitting area TA1. At this time, the inorganic film 120 remains in the second light transmitting area TA2.

As the hole is formed in the first light transmitting area TA1 after the light emitting element 200 is encapsulated by the encapsulation member 330 and the second substrate 350, the light emitting element 200 may be protected from particles or the like, which may be generated in the process of forming the hole. The encapsulation member 330 may prevent the particles or the like from penetrating into the light emitting element 200.

The optical member 10 is disposed in the first light transmitting area TA1. External light may be incident on the optical member 10 through the hole, or light may be emitted from the optical member 10 to the outside through the hole. The light transmitting area TA in FIG. 10 is an opening structure.

FIG. 11 is a cross-sectional view showing an exemplary embodiment in which the display device of FIG. 2 is encapsulated.

Referring to FIG. 11, the remaining portion of the emission layer 220 and the common electrode 230 remaining in the second light transmitting area TA2 is removed, and a protective layer 300 covering the display area DA and the light transmitting area TA is formed. The protective layer 300 may be formed by a chemical vapor deposition method. For example, using the chemical vapor deposition method, a thin film layer may be deposited on an underlying layer with a good step coverage. The protective layer 300 may include an inorganic layer 310 and an organic layer 320. The inorganic layer 310 may include an inorganic material including oxide or nitride. The organic layer 320 may include organic-inorganic composite particles.

The protective layer 300 may encapsulate the upper surface of the light emitting element 200 in the display area DA. Furthermore, the protective layer 300 may encapsulate side surfaces of the emission layer 220 and the common electrode 230, that is, a side surface of the light emitting element 200, exposed by the step difference of the lower inorganic layer at the boundary between the display area DA and the light transmitting area TA. Penetration of moisture or the like through the boundary surfaces of the emission layer 220 and the common electrode 230, which are exposed by being disconnected at the boundary between the display area DA and the light transmitting area TA by the step difference of the lower inorganic layer, may be prevented.

The optical member 10 is disposed in the first light transmitting area TA1. External light may be incident on the optical member 10 or light may be emitted from the optical member 10 to the outside through the first substrate 100, the inorganic film 120, and the protective layer 300. The light transmitting area TA in FIG. 11 is a hole structure.

Figure 12:
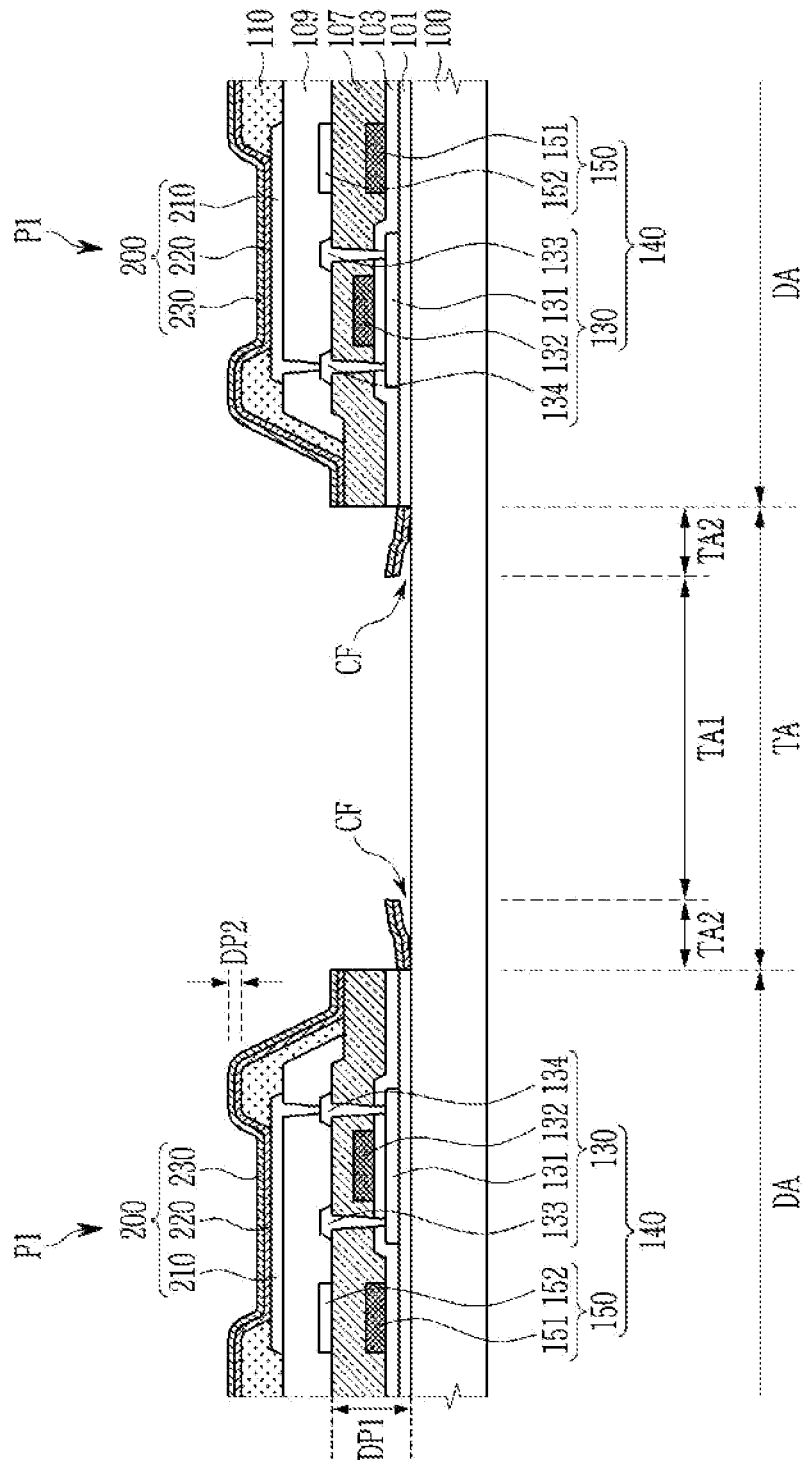
FIG. 12 is a cross-sectional view of a display device according to an exemplary embodiment of the present invention.

Hereinafter, a display device according to an exemplary embodiment is described with reference to FIG. 12, and a manufacturing method of a display device according to an exemplary embodiment is described with reference to FIG. 13 to FIG. 15. An exemplary embodiment in which the display device in FIG. 12 is encapsulated is described with reference to FIG. 16. The differences from the above-described FIG. 1 to FIG. 11 will be mainly described.

FIG. 12 is a cross-sectional view of a display device according to an exemplary embodiment of the present invention.

Referring to FIG. 12, the display device of FIG. 12 does not include the inorganic film 120 as compared with the display device of FIG. 2. When the first substrate 100 is made of a material such as glass or an inorganic material, the sacrificial layer is easily separated from the first substrate 100 by physical force during the manufacturing process of the display device. Therefore, the step of forming the inorganic film 120 is omitted, and the buffer layer 101 and the gate insulating layer 103 are completely removed from the light transmitting area TA.

The remaining portion of the emission layer 220 and the common electrode 230 remaining in the second light transmitting area TA2 remains in the manufacturing process of the display device. The remaining portion is disposed directly on the first substrate 100 with the lifting shape CF that is separated from the first substrate 100.

Except for these differences, all of the features of the exemplary embodiment described above with reference to FIG. 1 and FIG. 2 may be applied to the exemplary embodiment described with reference to FIG. 12. Therefore, redundant descriptions thereof are omitted.

Figure 13:
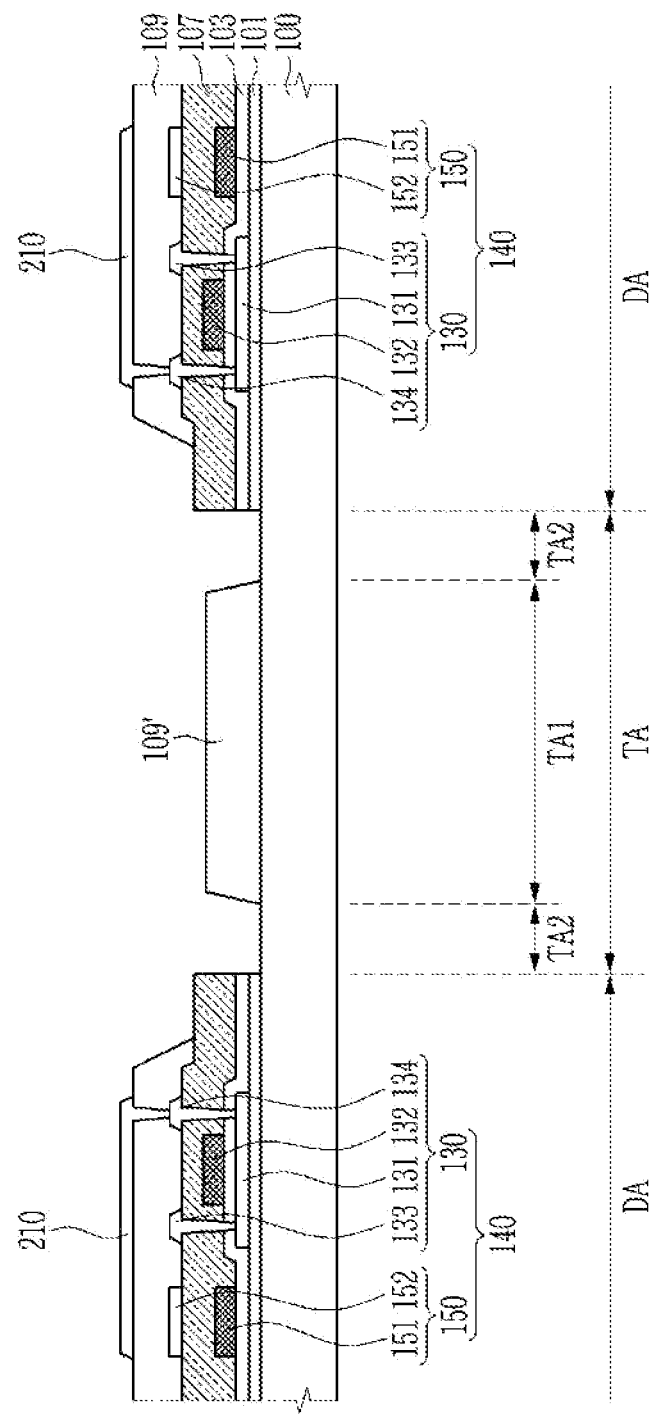
FIG. 13 to FIG. 15 are cross-sectional views showing a manufacturing method of a display device according to an exemplary embodiment of the present invention.
Figure 14:
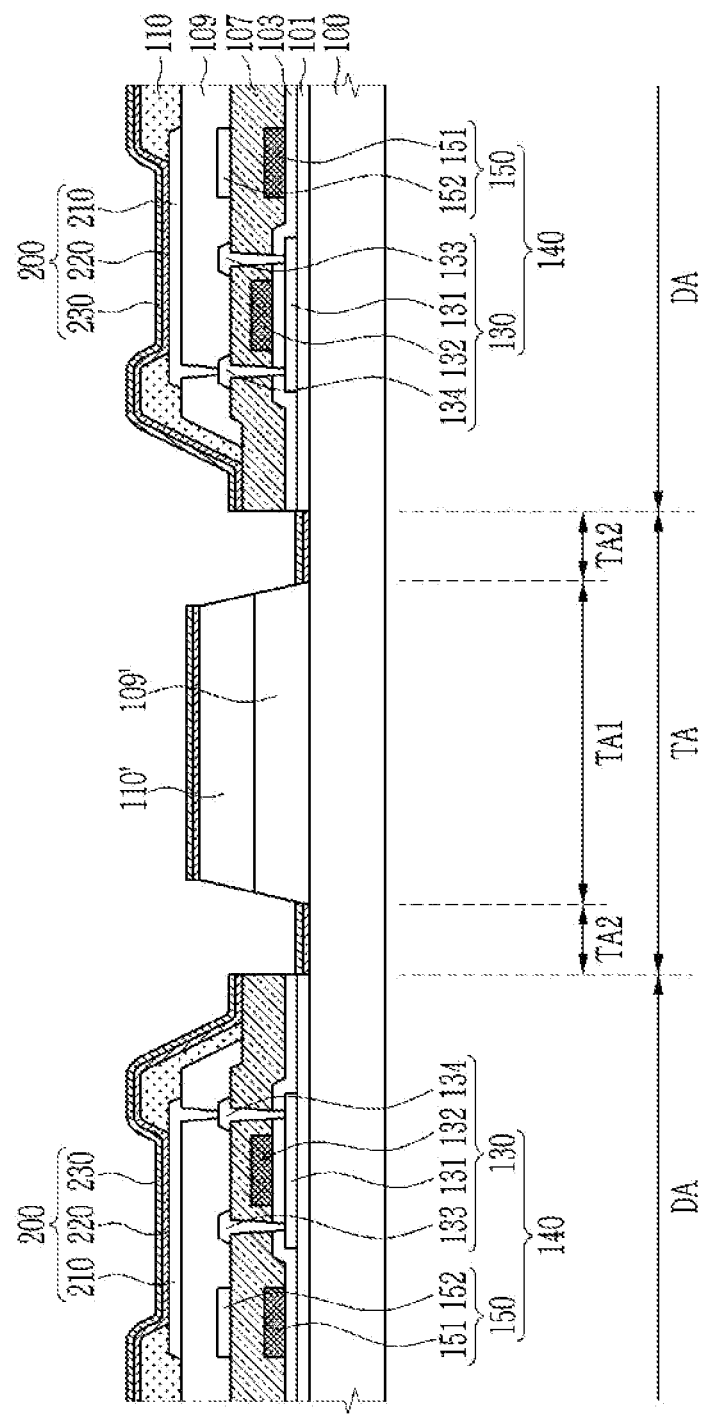
Figure 15:
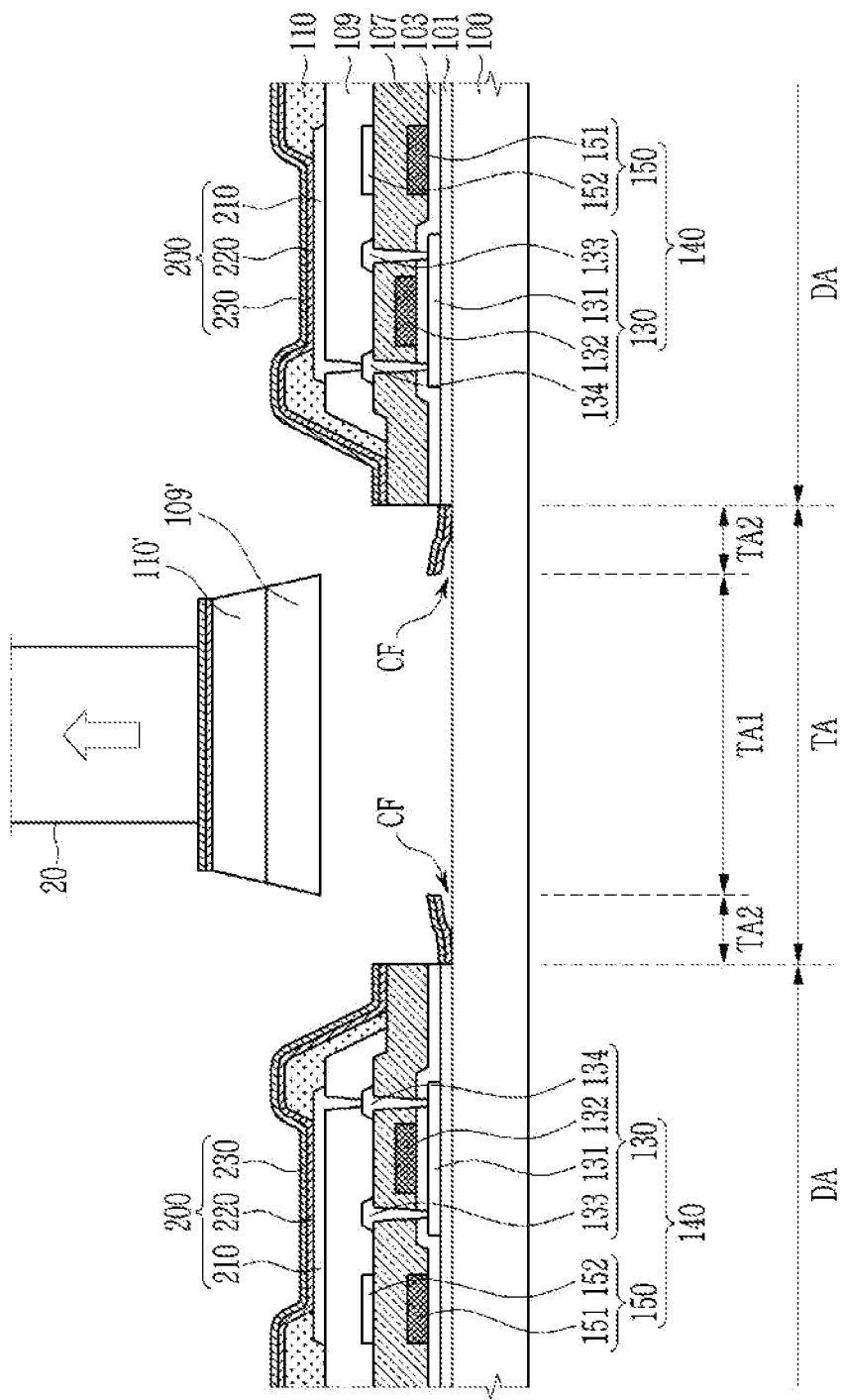

FIG. 13 to FIG. 15 are cross-sectional views showing a manufacturing method of a display device according to an exemplary embodiment of the present invention.

Referring to FIG. 13, the process of forming the inorganic film 120 of FIG. 5 after the manufacturing process of FIG. 3 and FIG. 4 described above is omitted, and the process of forming the first sacrificial layer 109' of FIG. 6 may proceed. That is, in comparison with FIG. 6, the first sacrificial layer 109' is formed directly on the first substrate 100 in the first light transmitting area TA1 in FIG. 13.

Referring to FIG. 14, the second sacrificial layer 110' is formed on the first sacrificial layer 109' formed directly on the first substrate 100.

According to an exemplary embodiment, without forming the first sacrificial layer 109', the second sacrificial layer 110' may be formed directly on the first substrate 100. Alternatively, the first sacrificial layer 109' may be formed in FIG. 13, and the emission layer 220 and the common electrode 230 may be formed directly on the first sacrificial layer 109' without forming the second sacrificial layer 110' in FIG. 14.

Referring to FIG. 15, the sacrificial layer may be adsorbed by a vacuum adsorption member 20 in a chamber (not shown) filled with a non-reactive gas such as nitrogen, and then the sacrificial layer may be separated from the first substrate 100 by physical force. As the first substrate 100 includes glass or an inorganic material, the sacrificial layer including the organic material may be easily separated from the first substrate 100. The upper surface of the first substrate 100 may be exposed in the first light transmitting area TA1 by separating the sacrificial layer from the first substrate 100.

Except for these differences, all of the features of the exemplary embodiment described above with reference to FIG. 3 to FIG. 8 may be applied to the exemplary embodiment described with reference to FIG. 13 to FIG. 15. Therefore, redundant descriptions thereof are omitted.

Figure 16:
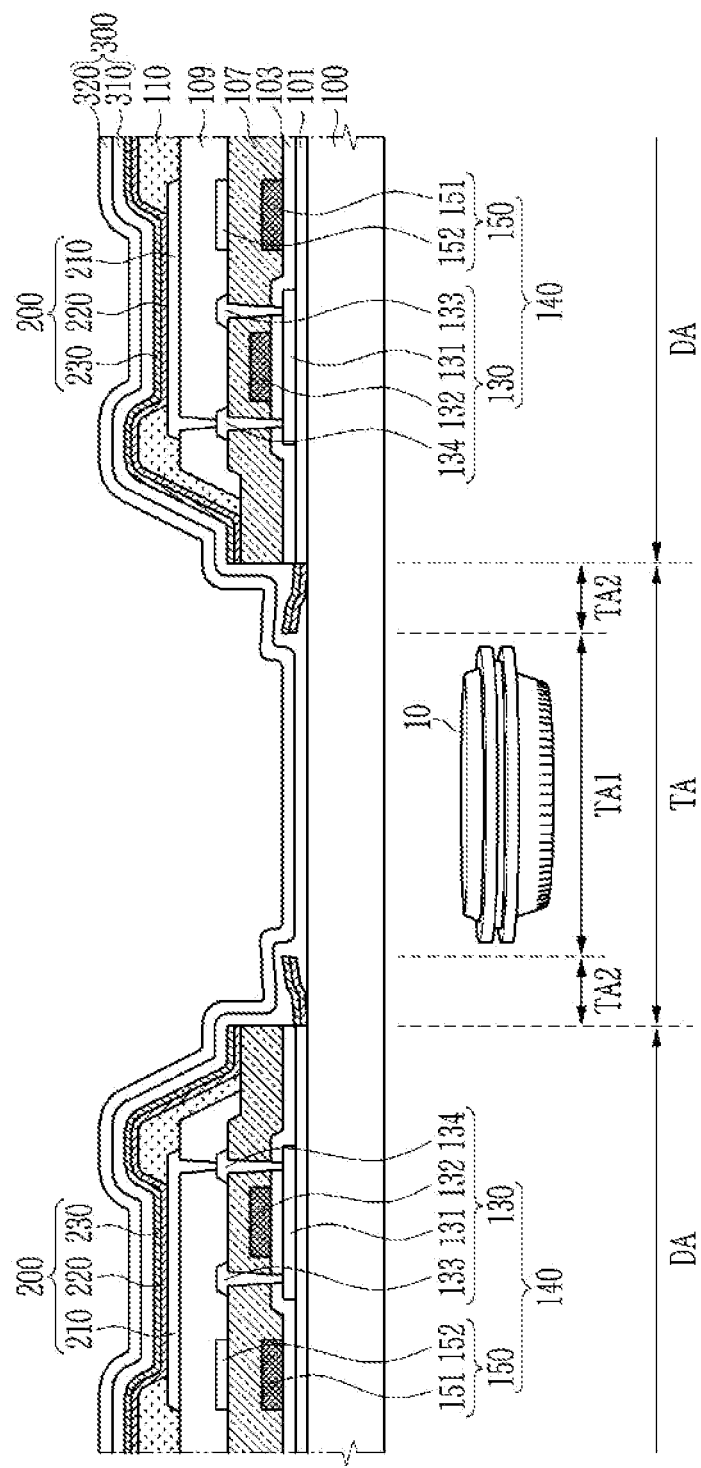
FIG. 16 is a cross-sectional view showing an exemplary embodiment in which the display device of FIG. 12 is encapsulated.

FIG. 16 is a cross-sectional view showing an exemplary embodiment in which the display device of FIG. 12 is encapsulated.

Referring to FIG. 16, the protective layer 300 covering the display area DA and the light transmitting area TA is formed without removing the remaining portion of the emission layer 220 and the common electrode 230 from the second light transmitting area TA2. The remaining portion is encapsulated by the protective layer 300, and moisture or foreign matter may be prevented from penetrating through the remaining portion along the boundary of the layer.

In an example embodiment, the common electrode 230 may be a reflective electrode and thus the remaining portion of the emission layer 220 and the common electrode 230 remaining in the second transmitting area TA2 may function as a light blocking member which blocks light at the boundary between the display area DA and the first transmitting area TA1.

Except for these differences, all of the features of the exemplary embodiment described above with reference to FIG. 11 may be applied to the exemplary embodiment described with reference to FIG. 16. Therefore, redundant descriptions are omitted.

The drawings referred to and the detailed description of the present invention disclosed up to now are just exemplary in the present invention, and they are used for describing the present invention and are not used to limit the meaning or scope of the present invention disclosed in the claims. Accordingly, those skilled in the art to which the invention pertains can easily understand that various modifications and equivalent embodiments may be possible. Therefore, a substantial technical protective range of the present invention will be determined based on a technical idea of the appended claims.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a first substrate including a display area in which a plurality of pixels are arranged and a light transmitting area disposed in the display area;
    an interlayer insulating layer covering the display area and exposing the light transmitting area, an inner sidewall of the interlayer insulating layer defining the light transmitting area;
    an inorganic film disposed directly on the light transmitting area of the first substrate and overlapping the entire light transmitting area,
    wherein the inorganic film is disposed only on the light transmitting area, and
    wherein a diameter of the light transmitting area is 60 or more times a width of one pixel of the plurality of pixels; and
    a protective layer continuously covering the display area and the light transmitting area,
    wherein the protective layer entirely covers the inner sidewall of the interlayer insulating layer defining the light transmitting area.

2. The display device of claim 1,
    wherein the display area includes:
    a buffer layer disposed only on display area of the first substrate; and
    a transistor disposed on the buffer layer.

3. The display device of claim 2, wherein
    the inorganic film includes the same material as the buffer layer, and
    a thickness of the inorganic film is equal to a thickness of the buffer layer.

4. The display device of claim 2,
    wherein the transistor includes:
    a semiconductor layer;
    a gate electrode; and
    a gate insulating layer disposed between the semiconductor layer and the gate electrode, and wherein a thickness of the inorganic film is equal to a sum of a thickness of the buffer layer and a thickness of the gate insulating layer.

5. The display device of claim 1, further comprising:
a second substrate covering the display area and the light transmitting area; and
an encapsulation member disposed in a second light transmitting area and encapsulating the display area,
wherein the light transmitting area includes a first light transmitting area in which an optical member is disposed and the second light transmitting area surrounding the first light transmitting area.

6. The display device of claim 5, wherein
a lower portion of the encapsulation member is in contact with the inorganic film in the second light transmitting area, and an upper portion of the encapsulation member is in contact with a lower surface of the second substrate in the second light transmitting area.

7. The display device of claim 5, further comprising
a hole penetrating the first substrate, the inorganic film, and the second substrate.

8. The display device of claim 1,
wherein the protective layer encapsulates a side surface of a light emitting element included in the plurality of pixels at a boundary between the display area and the light transmitting area, and
wherein the protective layer includes an inorganic layer and an organic layer.

* * * * *